United States Patent
Moon et al.

(10) Patent No.: US 8,900,997 B2
(45) Date of Patent: Dec. 2, 2014

(54) METHOD FOR FORMING A DUAL DAMASCENE STRUCTURE OF A SEMICONDUCTOR DEVICE, AND A SEMICONDUCTOR DEVICE THEREWITH

(71) Applicants: Joon-Young Moon, Uiwang-si (KR);
Youn-Jin Cho, Uiwang-si (KR);
Sung-Jae Lee, Uiwang-si (KR);
You-Jung Park, Uiwang-si (KR);
Yong-Woon Yoon, Uiwang-si (KR);
Chul-Ho Lee, Uiwang-si (KR);
Chung-Heon Lee, Uiwang-si (KR)

(72) Inventors: Joon-Young Moon, Uiwang-si (KR);
Youn-Jin Cho, Uiwang-si (KR);
Sung-Jae Lee, Uiwang-si (KR);
You-Jung Park, Uiwang-si (KR);
Yong-Woon Yoon, Uiwang-si (KR);
Chul-Ho Lee, Uiwang-si (KR);
Chung-Heon Lee, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 14/072,881

(22) Filed: Nov. 6, 2013

(65) Prior Publication Data
US 2014/0175669 A1    Jun. 26, 2014

(30) Foreign Application Priority Data

Dec. 26, 2012    (KR) ......................... 10-2012-0153753

(51) Int. Cl.
*H01L 21/44*    (2006.01)
*H01L 23/522*    (2006.01)
*H01L 23/532*    (2006.01)
*H01L 21/768*    (2006.01)

(52) U.S. Cl.
CPC ...... *H01L 21/76879* (2013.01); *H01L 23/5226* (2013.01); *H01L 23/53295* (2013.01)
USPC .......................................................... 438/675

(58) Field of Classification Search
CPC ..................... H01L 21/76879; H01L 23/5226; H01L 23/53295
USPC ........................................... 257/774; 438/675
See application file for complete search history.

(56) References Cited

U.S. PATENT DOCUMENTS 6,319,815 B1 *    11/2001    Iguchi et al. .................. 438/624

(Continued)

FOREIGN PATENT DOCUMENTS

KR    10-2002-0070630 A    9/2002
KR    10-2002-0070631 A    9/2002

(Continued)

*Primary Examiner* — A. Sefer
(74) *Attorney, Agent, or Firm* — Lee & Morse, P.C.

(57) ABSTRACT

Forming a dual damascene structure includes forming a first insulation layer and a second insulation layer, forming a resist mask, forming a via hole down to a lower end of the first insulation layer, forming a hardmask layer in the via hole and on the second insulation layer using a spin-coating method, forming a resist mask, forming a first trench hole down to a lower end of the second insulation layer, respectively removing a part of the hardmask layer in the via hole and a part of the hardmask layer on the second insulation layer, forming a second trench hole by removing a part of the first insulation layer between a top corner of the hardmask layer remaining in the via hole and a bottom corner of the first trench hole, removing the hardmask layer, and filling the via hole and the second trench hole with a conductive material.

8 Claims, 1 Drawing Sheet

(56) References Cited

U.S. PATENT DOCUMENTS

| | | | |
|---|---|---|---|
| 6,426,298 B1 * | 7/2002 | Chen et al. | 438/699 |
| 6,514,856 B2 * | 2/2003 | Matsumoto | 438/637 |
| 7,611,986 B2 * | 11/2009 | Olmen et al. | 438/637 |
| 2001/0006848 A1 | 7/2001 | Allada et al. | |
| 2003/0170978 A1 | 9/2003 | Lee | |
| 2012/0129337 A1 | 5/2012 | Chen et al. | |

FOREIGN PATENT DOCUMENTS

| | | | |
|---|---|---|---|
| KR | 10-2003-0079994 A | | 10/2003 |
| KR | 10-2004-0031695 A | | 4/2004 |
| KR | 10-2004-58959 | * | 7/2004 |
| KR | 10-2008-0076235 A | | 8/2008 |

* cited by examiner

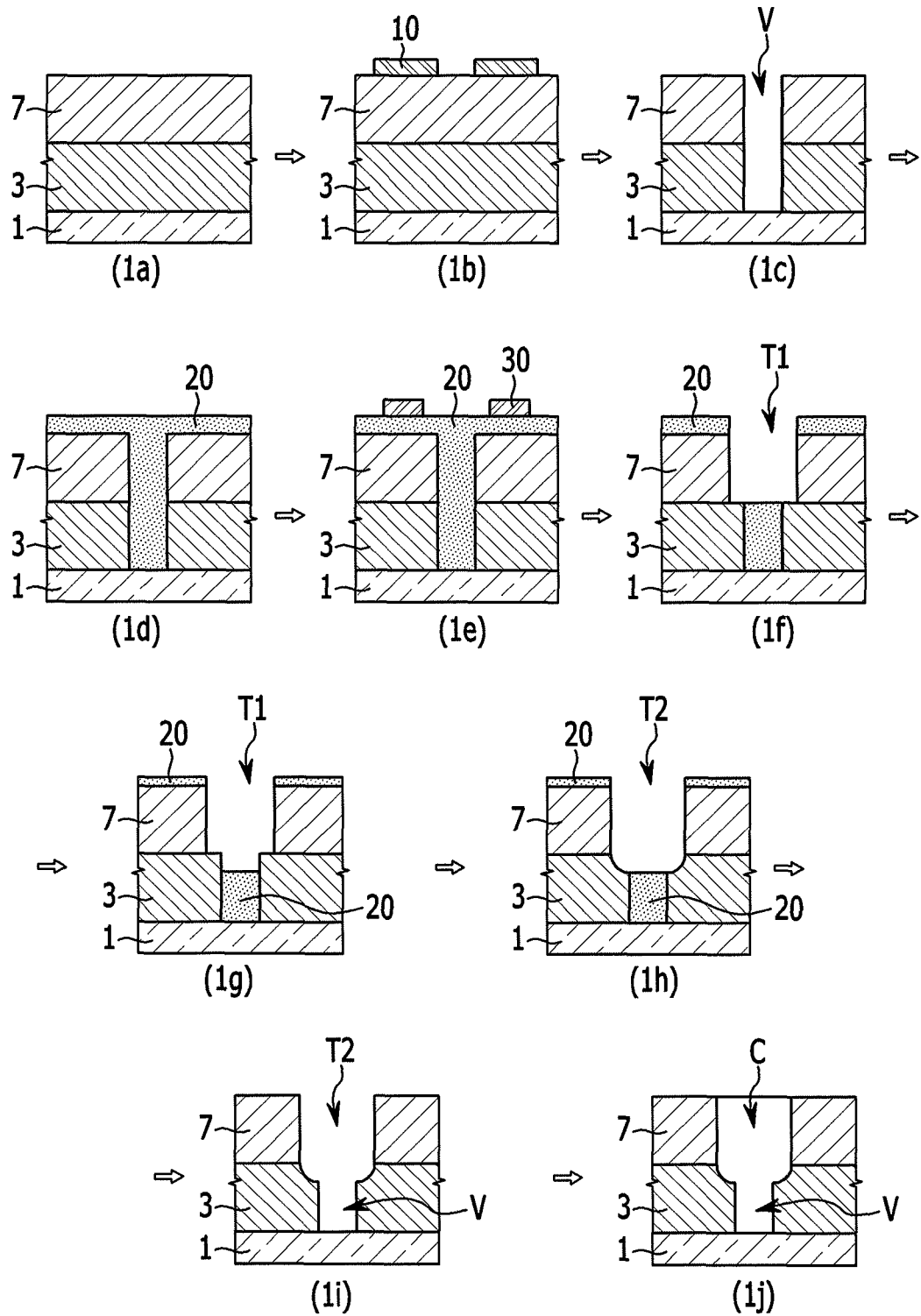

METHOD FOR FORMING A DUAL DAMASCENE STRUCTURE OF A SEMICONDUCTOR DEVICE, AND A SEMICONDUCTOR DEVICE THEREWITH

CROSS-REFERENCE TO RELATED APPLICATION

Korean Patent Application No. 10-2012-0153753, filed on Dec. 26, 2012, in the Korean Intellectual Property Office, and entitled: "A Method for Forming a Dual Damascene Structure of a Semiconductor Device, and a Semiconductor Device Therewith," is incorporated by reference herein in its entirety.

BACKGROUND

1. Field

Embodiments relate to a method for forming a dual damascene structure of a semiconductor device, and a semiconductor device therewith.

2. Description of the Related Art

As demand for integration of semiconductor devices has increased, characteristics of the semiconductor device, such as operation speed, resistance, and the like have been improved. For example, a copper (Cu) wire process may be used instead of an aluminum (Al) wire process, and a low dielectric constant (low k) material layer may be used instead of an oxidation layer as an insulating layer.

SUMMARY

Embodiments are directed to a method of forming a dual damascene structure of a semiconductor device, the method including sequentially forming a first insulation layer and a second insulation layer on a substrate, forming a resist mask having a pattern for forming a via hole on the second insulation layer, forming a via hole down to a lower end of the first insulation layer, forming a hardmask layer in the via hole and on the second insulation layer using a spin-coating method, forming a resist mask having a pattern for forming a trench hole on the hardmask layer, forming a first trench hole through the resist mask having the pattern for forming the trench hole, the first trench hole being formed down to a lower end of the second insulation layer, respectively removing a part of the hardmask layer in the via hole and a part of the hardmask layer on the second insulation layer, forming a second trench hole by removing a part of the first insulation layer between a top corner of the hardmask layer remaining in the via hole and a bottom corner of the first trench hole, removing the hardmask layer remaining in the via hole and on the second insulation layer, and forming an upper wire by filling the via hole and the second trench hole with a conductive material.

The second trench hole may have a curved shape in cross-section.

Forming the hardmask layer may include performing a heat treatment at a temperature ranging from about 200° C. to about 500° C.

The method may further include forming an auxiliary layer including silicon on the hardmask layer before the forming of the resist mask having the pattern for forming the trench hole.

The method may further include forming a bottom antireflective coating before the forming of the hardmask layer.

In the forming of the hardmask layer, the hardmask layer may be formed to be about 2000 Å to about 3800 Å thick, measured with reference to the upper end of the second insulation layer.

The first trench hole may be formed to have a depth of about 40% to about 80% of a combined thickness the first insulation layer and the second insulation layer.

After respectively removing the part of the hardmask layer in the via hole and the part of the hardmask layer on the second insulation layer, the hardmask layer remaining in the via hole and the hard mask layer remaining on the second insulation layer may be respectively about 9500 Å to about 10,000 Å and about 500 Å to about 1000 Å thick.

Embodiments are also directed to a semiconductor device including a plurality of patterns, which is fabricated according to the method as claimed in claim 1.

BRIEF DESCRIPTION OF THE DRAWING

Features will become apparent to those of skill in the art by describing in detail example embodiments with reference to the attached drawing, in which:

FIG. 1 illustrates stages in a method of forming a dual damascene structure of a semiconductor device according to an example embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art. In the drawing FIGURE, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a method of forming a dual damascene structure of a semiconductor device according to an embodiment is illustrated referring to FIG. 1.

FIG. 1 illustrates stages in a method of forming a dual damascene structure of a semiconductor device according to an example embodiment.

Referring to illustration 1a in FIG. 1, according to the present example embodiment, a first insulation layer 3 and a second insulation layer 7 are sequentially formed on a substrate 1.

The substrate 1 may have a metal wire (not shown) or lower structure, e.g. a semiconductor device and the like. In addition, an etch-stop layer (not shown) may be formed between the first insulation layer 3 and the substrate 1.

The first insulation layer 3 and the second insulation layer 7 may be formed of a general insulating material used in the dual damascene process for a semiconductor device, e.g., TEOS (tetraethyl orthosilicate).

Next, referring to illustration 1b in FIG. 1, a resist mask 10 having a pattern for forming a via hole is formed on the second insulation layer 7. The resist mask 10 may be formed using, e.g., a chemical vapor deposition or spin-coating method.

Then, referring to illustration 1c in FIG. 1, a via hole (V) is etched using the pattern of the resist mask 10. In the present example embodiment, the via hole (V) is formed down to the lower end of the first insulation layer 3, e.g., the via hole (V)

is formed through the second insulation layer 7 and the first insulation layer 3 so as to expose the substrate 1. As shown in illustration 1c of FIG. 1, when the via hole (V) is complete, the resist mask 10 on the second insulation layer 7 may be removed.

Then, referring to illustration 1d in FIG. 1, a hardmask layer 20 is formed in the via hole (V) and on the second insulation layer 7. As shown in illustration 1d in FIG. 1, the hardmask layer 20 may fill the via hole (V) and cover the second insulation layer 7 adjacent to the via hole (V). The hardmask layer 20 works as an interlayer transmitting the fine pattern of the resist to the material layer through a selective etching process. In the present example embodiment, the hardmask layer 20 is formed using a spin-coating method.

The hardmask layer 20 formed using the spin-coating method may provide an excellent gap-filling characteristic, and may provide a better gap-filling characteristic than a hardmask layer formed using a chemical vapor deposition method. Accordingly, the hardmask layer 20 formed using the spin-coating method may fill the via hole without a void despite increases in the aspect ratio of the pattern as the pattern becomes finer. The hardmask layer 20 formed using the spin-coating method may make it possible to design various structures of a device and improve reliability of the device compared with the hardmask layer formed in the chemical vapor deposition method.

The hardmask layer 20 is formed to have a predetermined height on the second insulation layer 7 by coating a hardmask composition in the via hole (V) and on the second insulation layer 7. For example, the hardmask layer 20 may be about 2000 Å to about 3800 Å thick. Herein, the thickness of the hardmask layer 20 is measured with reference to the upper end of the second insulation layer 7. When the hardmask layer 20 has a thickness within the range it may easily transmit a pattern and simultaneously secure sufficient etching resistance.

The formation of the hardmask layer 20 may further include a heat-treatment at about 200° C. to about 500° C. For example, the heat treatment may be performed in a range of about 350° C. to about 400° C. The heat treatment within the temperature range may secure sufficient cross-linking and gap-filling characteristics of the hardmask composition, and improve efficiency in a subsequent trench formation process. The heat treatment may be performed in the air or under a nitrogen atmosphere.

Before forming the hardmask layer 20, a bottom antireflective coating (BARC) layer (not shown) may be further formed. An auxiliary layer (not shown) including silicon may be formed on the hardmask layer 20. The auxiliary layer along with the hardmask layer 20 may play a role of providing etching resistance.

Next, referring to illustration 1e in FIG. 1, a resist mask 30 having a pattern for forming a trench hole is formed on the hardmask layer 20.

Next, referring to illustration 1f in FIG. 1, the resist mask 30 is used to form a first trench hole T1. The first trench hole T1 is formed down to the lower end of the second insulation layer 7. When the first trench hole T1 is complete, the resist mask 30 is removed.

The first trench hole T1 may be patterned to have a depth of about 40% to 80% of the thickness sum of the first insulation layer 3 and the second insulation layer 7 when the thickness sum is 100%. The first trench hole T1 may be about 3200 Å to 7200 Å deep when TEOS 9K, for example, is used as a deposition material. When the first trench hole T1 has a depth within the stated range, a margin regulating a structure of a via top corner and a trench bottom corner in a subsequent process may be secured. The margin may make an etching rate difference between a fine pattern of loading/micro-loading and a wide pattern during dry etching uniform.

Then, referring to illustration 1g in FIG. 1, the hardmask layer 20 formed in the via hole (V) and on the second insulation layer 7 is partially removed. In an implementation, portions of the hardmask layer 20 remaining in the via hole (V) and on the second insulation layer 7 after partially removing the hardmask layer 20 are respectively about 9500 Å to about 10,000 Å thick and about 500 Å to about 1000 Å thick. The thickness of the remaining hardmask layer 20 is obtained with reference to TEOS 9K as a deposition material. The hardmask layer 20 in the via hole (V) is partially removed and left within the range, so that the structure of a via top corner and a trench bottom corner may be easily designed, forming a fine pattern. In addition, the hardmask layer 20 on the second insulation layer 7 is partially removed and left within the range, so that the remaining hardmask layer 20 may work as an etch resistance layer in a subsequent process of forming a second trench hole T2.

Herein, the partial removal of the hardmask layer 20 in the via hole (V) and the second insulation layer 7 may be performed under a chamber pressure ranging from about 5 mTorr to about 10 mTorr, a high frequency (60 M) RF electric power ranging from about 100 W to about 500 W, a low frequency (2 M) RF electric power ranging from about 1000 W to about 2000 W, and an $O_2$ gas flow rate ranging from about 20 SCCM to about 50 SCCM for about 5 seconds to about 10 seconds.

Referring to illustration 1h in FIG. 1, after Partially removing the hardmask layer 20 in the via hole (V) and the second insulation layer 7, the second trench hole T2 is formed by partially removing the first insulation layer 3 between the top corner of the via hole (V) (via top corner) and the bottom corner of the first trench hole T1 (trench bottom corner).

According to the present example embodiment, the lower end of the second trench hole T2 may have a curved shape. Thus, the via top corner of the via hole (V) and the trench bottom corner of the first trench hole T1 may be connected with a curved line in the cross-section of a semiconductor pattern. When the lower end of the second trench hole T2 is smoothly curved, efficiency in a subsequent process of depositing a conductive material may be increased.

Referring to illustration 1i in FIG. 1, when the second trench hole T2 is formed, the hardmask layer 20 remaining in the via hole (V) and on the second insulation layer 7 is removed. The removal of the hardmask layer 20 remaining in the via hole (V) may also include removing an etch-stop layer (not shown) exposed at the lower end of the via hole (V).

Then, referring to illustration 1j in FIG. 1, the via hole (V) and the second trench hole T2 are filled with a conductive material to form an upper wire. The conductive material may be, e.g., copper (Cu). The filling may be performed with a deposition method.

According to another example embodiment, a semiconductor device including a plurality of patterns fabricated in the method of forming a dual damascene structure is provided.

By way of summation and review, using a copper (Cu) wire process instead of an aluminum (Al) wire process, and using a dual damascene process using a low dielectric constant (low k) material layer instead of an oxidation layer as an insulating layer may improve characteristics of the semiconductor device such as operation speed, resistance, and the like have been adopted.

The dual damascene process may be classified as a via-first dual damascene (VFDD) process of first etching a via hole and then forming a trench hole, and a trench-first dual damascene (TFDD) process of first etching a trench hole and then forming a via hole. The via-first dual damascene process may contribute to increasing efficiency in a subsequent process of forming a wire by regulating an angle between a via top corner and a trench bottom corner, when the trench hole is etched after etching the via hole, and then charging it with a hardmask composition.

As described above, example embodiments may provide a method of manufacturing a semiconductor device, and a method of forming a dual damascene structure for a copper wire. An example embodiment may provide a method of forming a dual damascene structure of a semiconductor device by spin-coating a hardmask composition to help control a profile between a via top corner and a trench bottom corner. Another example embodiment may provide a semiconductor device fabricated according to the method of forming a dual damascene structure. An example embodiment may provide a structure of a via top corner and a trench bottom corner, which is advantageous for a subsequent process, by applying a hardmask composition in a spin-coating method.

<Description of Symbols>

| | |
|---|---|
| 1: substrate | 3: first insulation layer |
| 7: second insulation layer | 10, 30: resist mask |
| 20: hardmask layer | V: via hole |
| T1: first trench hole | T2: second trench hole |

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a dual damascene structure of a semiconductor device, the method comprising:
    sequentially forming a first insulation layer and a second insulation layer on a substrate;
    forming a resist mask having a pattern for forming a via hole on the second insulation layer;
    forming a via hole down to a lower end of the first insulation layer;
    forming a hardmask layer in the via hole and on the second insulation layer using a spin-coating method;
    forming a resist mask having a pattern for forming a trench hole on the hardmask layer;
    forming a first trench hole through the resist mask having the pattern for forming the trench hole, the first trench hole being formed down to a lower end of the second insulation layer;
    respectively removing a part of the hardmask layer in the via hole and a part of the hardmask layer on the second insulation layer;
    forming a second trench hole by removing a part of the first insulation layer between a top corner of the hardmask layer remaining in the via hole and a bottom corner of the first trench hole;
    removing the hardmask layer remaining in the via hole and on the second insulation layer; and
    forming an upper wire by filling the via hole and the second trench hole with a conductive material.

2. The method as claimed in claim 1, wherein the second trench hole has a curved shape in cross-section.

3. The method as claimed in claim 1, wherein forming the hardmask layer includes performing a heat treatment at a temperature ranging from about 200° C. to about 500° C.

4. The method as claimed in claim 1, further comprising forming an auxiliary layer including silicon on the hardmask layer before the forming of the resist mask having the pattern for forming the trench hole.

5. The method as claimed in claim 1, wherein, in the forming of the hardmask layer, the hardmask layer is formed to be about 2000 Å to about 3800 Å thick, measured with reference to the upper end of the second insulation layer.

6. The method as claimed in claim 1, wherein the first trench hole is formed to have a depth of about 40% to about 80% of a combined thickness the first insulation layer and the second insulation layer.

7. The method as claimed in claim 1, wherein, after respectively removing the part of the hardmask layer in the via hole and the part of the hardmask layer on the second insulation layer, the hardmask layer remaining in the via hole and the hard mask layer remaining on the second insulation layer are respectively about 9500 Å to about 10,000 Å and about 500 Å to about 1000 Å thick.

8. A semiconductor device comprising a plurality of patterns, which is fabricated according to the method as claimed in claim 1.

* * * * *